United States Patent [19]
Mathews et al.

[11] Patent Number: 5,702,986
[45] Date of Patent: Dec. 30, 1997

[54] LOW-STRESS METHOD OF FABRICATING FIELD-EFFECT TRANSISTORS HAVING SILICON NITRIDE SPACERS ON GATE ELECTRODE EDGES

[75] Inventors: Viju K. Mathews; Pierre C. Fazan; Nanseng Jeng, all of Boise, Id.

[73] Assignee: Micron Technology, Inc., Boise, Id.

[21] Appl. No.: 567,692

[22] Filed: Dec. 5, 1995

[51] Int. Cl.$^6$ .................................. H01L 21/84
[52] U.S. Cl. ..................... 438/163; 438/197; 438/230
[58] Field of Search .................. 437/44, 41 SW, 437/41 RLD, 40 SW, 247, 29

[56] References Cited

U.S. PATENT DOCUMENTS

| | | | |
|---|---|---|---|
| 5,015,595 | 5/1991 | Wollesen | 437/41 SW |
| 5,102,816 | 4/1992 | Manukonda et al. | 437/44 |
| 5,244,823 | 9/1993 | Adan | 437/44 |
| 5,298,446 | 3/1994 | Onishi et al. | 437/41 SW |
| 5,424,234 | 6/1995 | Kwon | 437/44 |
| 5,641,698 | 6/1997 | Lin | 437/44 |

*Primary Examiner*—Trung Dang
*Attorney, Agent, or Firm*—Angus C. Fox, III

[57] ABSTRACT

This invention is a process flow involving wordline spacer formation and source/drain implants which mitigates stress-induced damage to the silicon substrate during the post-implant anneal step. The process employs composite wordline spacers having a removable silicon dioxide portion and a non-removable silicon nitride portion. The post-implant anneal step is performed with only the silicon nitride portion of the spacer in place on the wordlines. The thinness of the silicon nitride portion greatly reduces the stress levels experienced by the substrate during the anneal as compared with that experienced by the substrate when thick one-piece silicon nitride spacers are left in place during the anneal.

20 Claims, 3 Drawing Sheets

LOW-STRESS METHOD OF FABRICATING FIELD-EFFECT TRANSISTORS HAVING SILICON NITRIDE SPACERS ON GATE ELECTRODE EDGES

FIELD OF THE INVENTION

This invention relates to processes for fabricating field-effect transistors in an integrated circuit and, more particularly, to processes requiring the use of silicon nitride implant spacers on transistor gate sidewalls.

DESCRIPTION OF THE PRIOR ART

Source/drain regions for insulated-gate, field-effect transistors are typically implanted into a semiconductor monocrystalline substrate (typically 1,1 silicon) as high-energy ions. Spacers deposited within the right angle formed by the sidewalls of transistor gates (e.g., wordlines in a memory array) and the substrate offset the implanted ions from the transistor gate sidewalls. The amount of offset can be easily adjusted for optimum transistor performance. During implantation, the crystalline structure of the substrate regions into which the ions are implanted is at least partially destroyed as material in those regions is converted to what might be best described as an amorphous material. The implantation of large ions such as arsenic causes considerably greater crystal damage than does the implantation of smaller ions such as phosphorus and boron. In any case, transistor function is severely impaired by substrate crystal damage in the transistor channel and source/drain regions. Thus, it is essential that the semiconductor material in the implanted regions be annealed so that the monocrystalline structure can be reestablished in those regions.

Contacts must frequently be made from an upper conductive layer to an underlying substrate through an interlevel dielectric layer. Contact is made with either a plug that is a downward extension of the upper conductive layer throughthe dielectric layer to the substrate, or a plug that is formed in a contact opening which penetrates the dielectric layer prior to depositing the upper conductive layer. Self-aligned contacts are being used with increasing frequency to increase circuit density. A self-aligned contact is one which is made between two adjacent wordlines, and which utilizes the entire available space between the spacer of one wordline and the spacer of the other wordline. It could also be said that a contact is self-aligned where it abuts the spacer of a single wordline. For self-aligned contacts, the wordline spacers are formed from a material that is largely unaffected by the etch employed to form the contact opening. Thus, when the contact plug is formed, it is "self-aligned" to the outer edges of the opposing wordline spacers. A self-aligned contact necessarily requires the use of an interlevel dielectric layer which can be etched selectively with respect to word line spacers. Because of stress considerations related to the use of silicon nitride, interlevel dielectric layers are typically formed from silicon dioxide-based materials. The use of silicon dioxide-based interlevel dielectric layers, however, requires the use of a different material, such as silicon nitride, for word line spacers if self-aligned contacts are to be formed. FIG. 1 is representative of a typical wordline spacer configuration for an N-channel insulated-gate field-effect transistor. In an integrated circuit a wordline functions as a gate electrode as it traverses an active area on the substrate and as a gate interconnect as it traverses field oxide regions between active areas. Wherever a wordline traverses an active area, it is insulated from the active area by a layer of gate oxide which, for current generations of integrated circuits, typically has a thickness within a range of 60–100 Å. A wordline, which was formed from a layer stack consisting of a doped polycrystalline silicon layer 11, a refractory metal silicide layer 12, a pad oxide layer 13, and a silicon nitride layer 14, is insulated from a silicon substrate 15 by a thermally-grown silicon dioxide gate dielectric layer 16. Prior to spacer formation, a boron anti-punchthrough implant and a low-dosage arsenic implant are performed such that both species are implanted in first substrate regions 17 that are aligned to the vertical edges of the wordline stack. Following the formation of thick silicon nitride spacers 18, a high-dosage arsenic implant is performed such that this species is implanted in second substrate regions 19 that are aligned to the outer edges of the spacers 18. Following the final implant, a post-implant anneal step is performed to repair any crystal damage sustained by the substrate as a result of the implants. It has been found that when a thick nitride spacer remains in contact with both a gate sidewall and the adjacent substrate during the post-implant anneal step, stresses are generated by the dissimilar materials which result in crystal defects near the gate edge which are represented by the curved lines 20. It should be mentioned that although there is beneath the spacers 18 a thin layer of silicon dioxide (not shown) comprised of both native oxide and thermal oxide formed during a source/drain reoxidation step employed to both to reduce the electric field at the gate edges and to repair the gate oxide at the gate edges following the word line etch, the existence of this thin silicon dioxide layer is insufficient to relieve the stress between the spacers 18 and the substrate 15.

A principal object of this invention is the development of a process for field-effect transistor fabrication which incorporates silicon nitride spacers on transistor gate sidewalls. The spacers must offset source/drain implants and protect the gate electrode during selective self-aligned contact etches without causing stress-induced crystal damage during the post-implant anneal step.

SUMMARY OF THE INVENTION

This invention is a process flow involving wordline spacer formation and source/drain implants which mitigates stress-induced damage to the silicon substrate during the post-implant anneal step. The process employs composite wordline spacers having a removable silicon dioxide portion and a non-removable silicon nitride portion. The process begins following wordline patterning and an optional source/drain reoxidation step. Anti-punchthrough and low-dosage source/drain implants are then performed. A conformal silicon nitride layer is subsequently deposited (preferably via chemical vapor deposition). The thickness of the silicon nitride layer is chosen so as to be less than half the thickness of the required spacer. Ideally the thickness of this layer is chosen to be approximately one-fourth to one-third of the desired final spacer thickness. A conformal silicon dioxide layer is then deposited (also preferably via chemical vapor deposition). Both conformal layers are then anisotropically etched using a plasma chemistry that, preferably, etches both layers at approximately the same rate. Composite spacers having both a silicon nitride portion and a silicon dioxide portion are thus formed on the wordline sidewalls. In a preferred embodiment of the process, a high-dosage source/drain implant is then performed with both portions of the composite spacers intact. In an alternative embodiment of the process, the high-dosage source/drain implant is performed with only the silicon nitride portion of the composite spacer intact. In this case, only the silicon nitride portion is relied on to block the implant.

Variations of the process are possible. In another embodiment, a separate low-dosage source/drain implant is dispensed with altogether. A single source/drain implant is performed with only the silicon nitride portion of the composite spacer in place. The implant energy is set so that a small amount of the implanted impurity penetrates the foot portion of the nitride spacer. A high-dosage implant results in the portion of the substrate that is uncovered.

DETAILED DESCRIPTION OF TH PREFERRED EMBODIMENT

It should be kept in mind that although only a single wordline or transitor gate is depicted in a cross-sectional format, a multitude of identical devices are being created simultaneously on a single semiconductor wafer.

Figure 2:
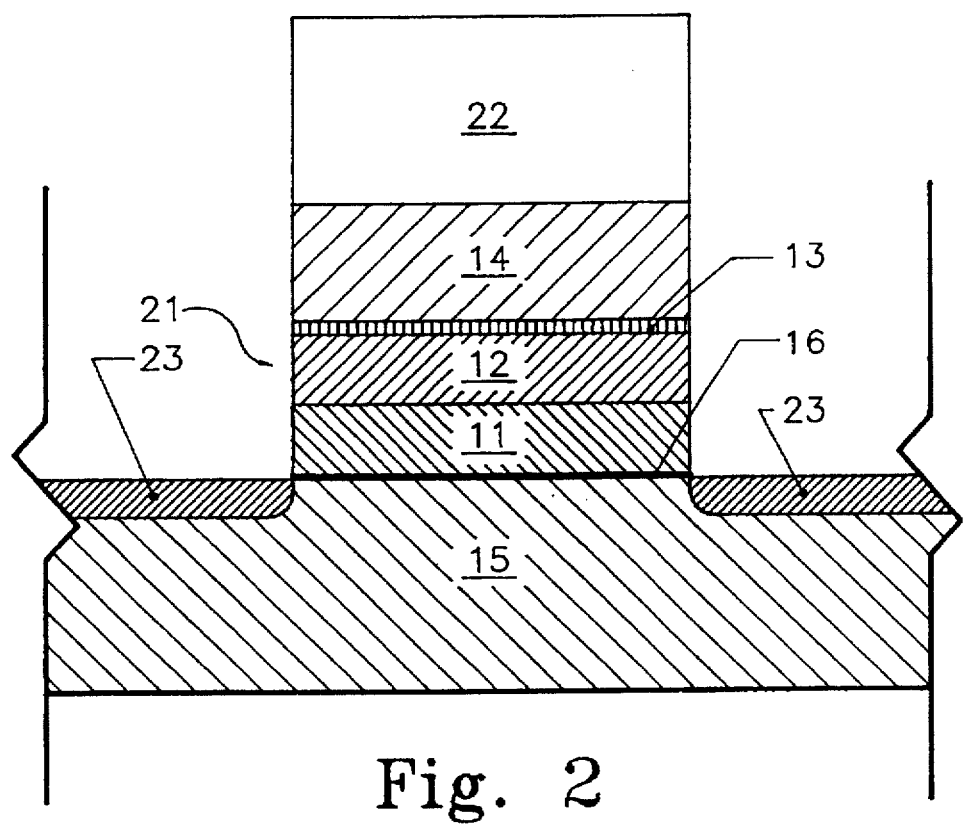
FIG. 2 is a cross-sectional view of a wordline following the formation thereof from a four-layer blanket stack.

Referring now to FIG. 2, a wordline 21 is shown subsequent to an anisotropic etch through a four-layer stack. Although the term anisotropic means literally not omnidirection, it has come to mean unidirectional within the semiconductor industry. It is generally recognized that a true anisotropic etch etches straight down and forms sidewalls on the structure being etched which are vertical or nearly so (assuming the wafer is held in a horizontal position during the etch). The wordline overlies a silicon dioxide gate dielectric layer 16 which was thermally grown on the substrate 15. The wordline is made up of a polycrystalline silicon ("polysilicon") layer which directly overlies the gate dielectric layer 16, a refractory metal silicide layer on top of the polysilicon layer 11, an optional pad oxide layer 13 on top of the silicide layer 12, and a silicon nitride insulative layer 14 on top of the pad oxide layer 13. The photoresist mask 22 used to define the wordline during the masking of the stack has not yet been stripped from the silicon nitride insulative layer 14. The process of forming wordlines from a one or more layers by masking and etching is called wordline patterning. Anti-punchthrough and low-dosage source/drain implants can be performed prior or subsequent to stripping the photoresist mask 22. For N-channel devices, boron is used as the anti-punchthrough implant and arsenic is used as the low-dosage source/drain implant. Both species are implanted vertically into a common region 23 on the upper surface of the substrate 15. Both implants are aligned to the vertical sidewalls of the wordline. Later in the process, elevated temperature steps will drive the two species at different rates, resulting in the boron impurity being driven farther beneath the gate edge than the arsenic impurity.

Figure 3:
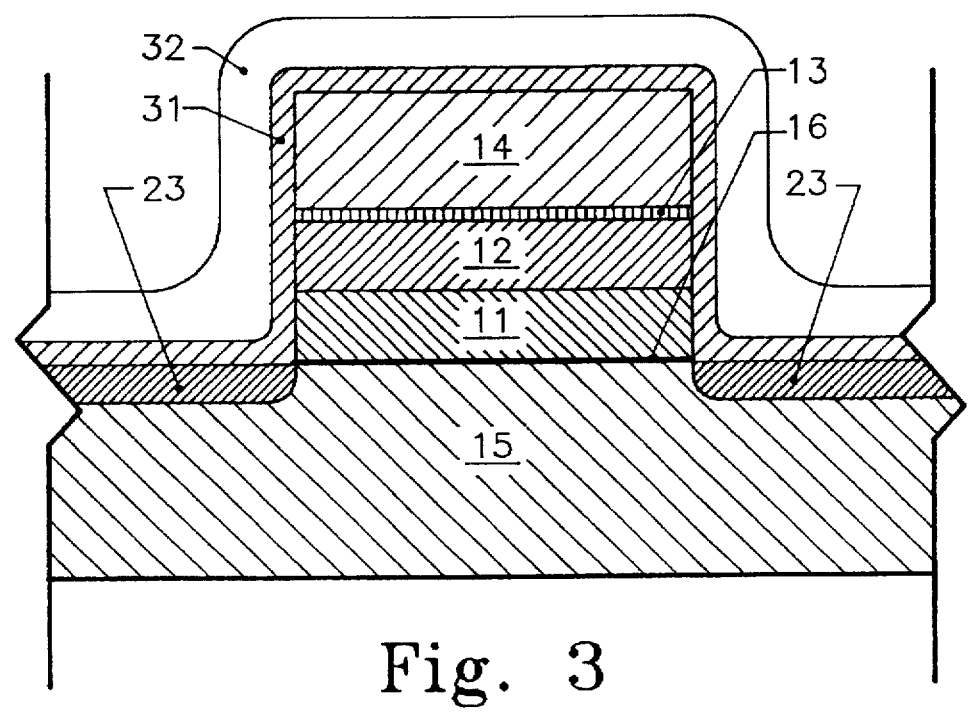
FIG. 3 is a cross-sectional view of the wordline of FIG. 2 following the deposition of a conformal silicon nitride layer and a conformal silicon nitride layer.

Referring now to FIG. 3, following removal of photoresist mask 22, a conformal silicon nitride layer 31 having a thickness of about one-fourth to one-third of the desired final spacer thickness is deposited (preferably via chemical vapor deposition) over the entire wafer (i.e., a blanket deposition).

This is followed by the blanket deposition (also preferably via CVD) of a conformal silicon dioxide layer 32 (preferably silicon dioxide from tetraethylortho silicate precursor gas). The thickness of the conformal silicon dioxide layer 32 is equal to the desired final spacer thickness minus the thickness of the conformal silicon nitride layer 31.

Figure 4:
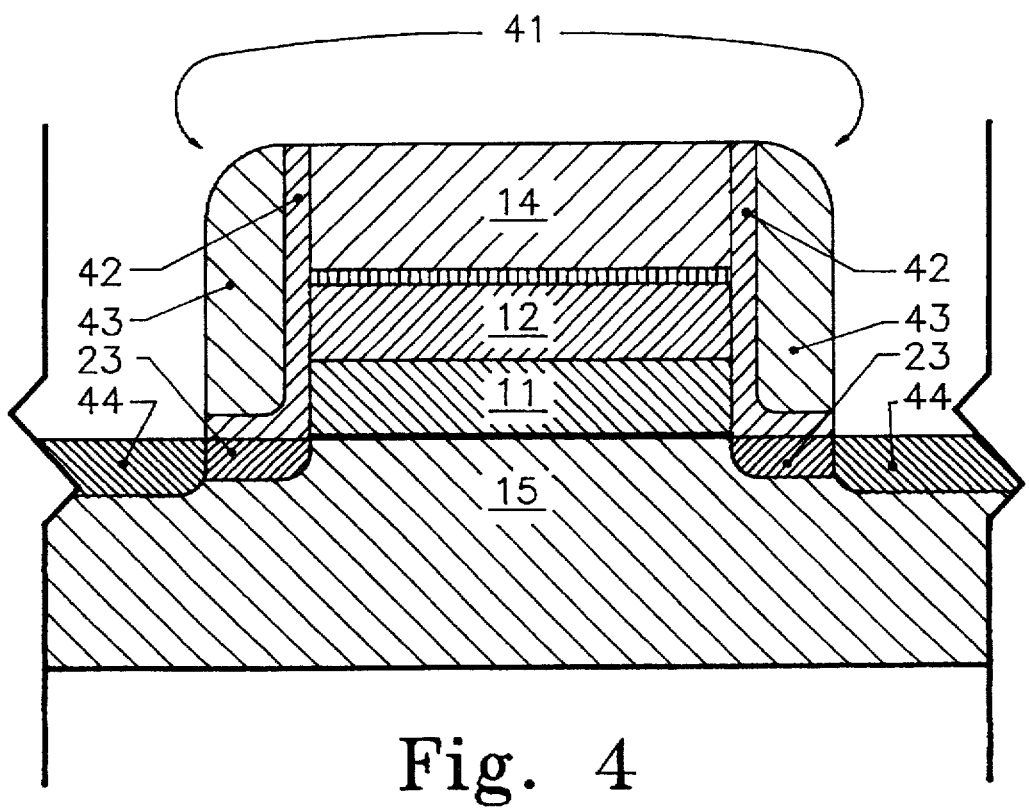
FIG. 4 is a cross-sectional view of the wordline of FIG. 3 following an anisotropic spacer etch.

Referring now to FIG. 4, an anisotropic spacer etch has created composite spacers 41 on both sides of the wordline 21. In a preferred embodiment of the process, a plasma etch chemistry is chosen that etches both layers (i.e., layers 31 and 32) at approximately the same rate. Each composite spacer comprises a silicon nitride portion 42 and a silicon dioxide portion 43. In a preferred embodiment of the invention, a high-dosage source/drain implant is performed with both portions of the composite spacers intact. For N-channel devices, arsenic is the preferred implant. The high-dosage source/drain implant results in an arsenic implanted substrate region 44.

Figure 5:
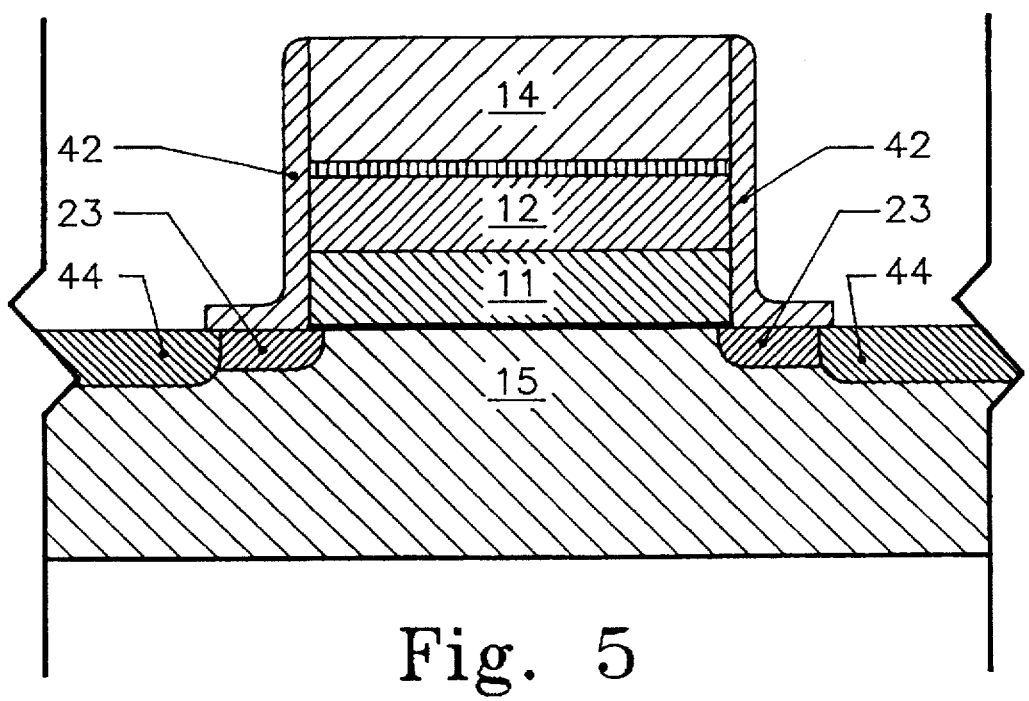
FIG. 5 is a cross-sectional view of the wordline of FIG. 4 following removal of the silicon dioxide portion of each spacer.

Referring to FIG. 5, the silicon dioxide portion 43 of each composite spacer 41 has been removed with (preferably) a wet isotropic etch. In an alternate embodiment of the invention, the high-dosage source/drain implant is performed subsequent to the removal of the silicon dioxide portions 43, and with only the silicon nitride portions 42 of the composite spacers 41 in place. In this case, only the silicon nitride portion 42 is relied on to block the implant. In yet another embodiment of the invention, a separate low-dosage source/drain implant (please refer to the paragraph which describes FIG. 2) is dispensed with altogether. A single source/drain implant is performed with only the silicon nitride portion 42 of the composite spacer 41 in place. The implant energy is set so that a small amount of the implanted impurity penetrates the foot portion of the silicon nitride portion 42 of composite spacer 41. A high-dosage implant results in the portion of the substrate that is uncovered.

Figure 1:
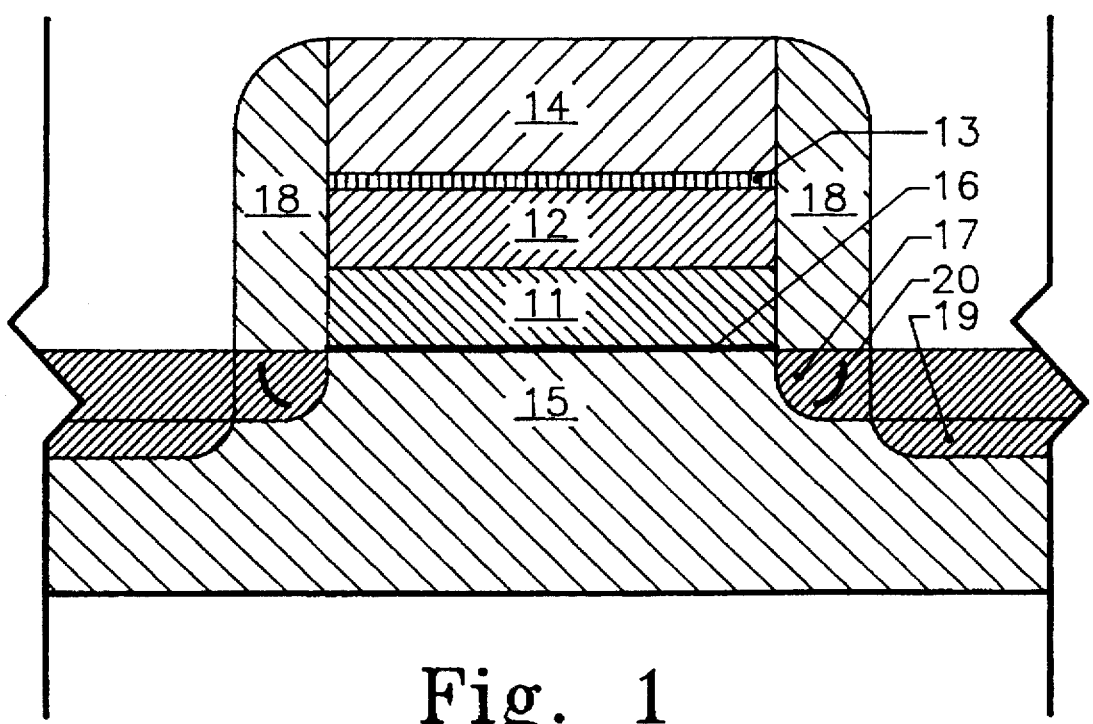
FIG. 1 is a cross-sectional view of a wordline having conventional one-part silicon nitride sidewall spacers.

After all necessary implants have been performed, a post-implant anneal is performed at a temperature within a range of about 500° to 1,000° C. A temperature of approximately 800° C. is considered optimal. The anneal step is performed with only the silicon nitride portions 41 of the composite spacers on the sidewalls of the wordlines 21. The thinness of the silicon nitride portions 41 reduces the stress generated on the substrate 15 far below the levels that are generated with the use of single-part, thick silicon nitride spacers 18 described in reference to FIG. 1. It will be noted that the elevated temperature has caused the implanted regions 23 and 44 to diffuse more deeply into the substrate 15.

Although only several embodiments of the invention have been disclosed and described herein, it will be obvious to those having ordinary skill in the art of integrated circuit manufacture that changes and modifications may be made thereto without departing from the scope and the spirit of the invention as hereinafter claimed.

I claim:

1. A process for mitigating stress-induced damage to a silicon substrate during post-implant annealing of source/drain regions of a field-effect transistor, said transistor having a gate electrode which has been formed on the substrate, said electrode having sidewalls which are approximately normal to the substrate, said electrode also having an upper surface that is covered by an insulative layer, said process comprising the steps of:

(a) depositing a conformal silicon nitride layer which covers the substrate, the sidewalls and the insulative layer;

(b) depositing a conformal silicon dioxide layer which covers the conformal silicon nitride layer;

(c) performing an anisotropic etch which forms spacers on each of the sidewalls, each spacer having both a silicon nitride portion and a silicon dioxide portion;

(d) performing a source/drain implant with at least the silicon nitride portion of the spacer on the sidewalls; and (e) performing a post-implant anneal with only the silicon nitride portion of the spacer on the sidewalls.

2. The process of claim 1, wherein said conformal silicon nitride layer has a thickness that is less than half the thickness of said conformal silicon dioxide layer.

3. The process of claim 1, wherein said insulative layer comprises silicon nitride.

4. The process of claim 1, wherein said silicon nitride portion has an "L"-shaped cross-section.

5. The process of claim 1, wherein said at least one source/drain implant is performed with both portions of each spacer on the sidewalls.

6. The process of claim 1, wherein said post-implant anneal is performed at a temperature within a range of about 500° C. to 1,000° C.

7. A process for forming an insulated-gate field-effect transistor on a silicon substrate, said process comprising the following steps:

(a) growing a gate dielectric layer on the substrate;

(b) depositing at least one conductive layer on top of the gate dielectric layer;

(c) depositing an insulative layer on top of said at least one conductive layer;

(d) forming a mask pattern on the insulative layer, said mask pattern having a profile which corresponds to that of a gate electrode;

(e) anisotropically etching through both the insulative layer and the conductive layer to form a gate electrode having a insulative layer portion, a conductive layer portion and sidewalls formed from both the edges of the insulative layer portion and the conductive layer portion;

(f) depositing a conformal silicon nitride layer which overlies the substrate and covers the sidewalls and the insulative layer portion;

(g) depositing a conformal silicon dioxide layer which covers the conformal silicon nitride layer;

(h) performing an anisotropic etch to form spacers from the silicon dioxide layer and the silicon nitride layer on each of the sidewalls, each spacer having both a silicon nitride portion and a silicon dioxide portion;

(i) performing a source/drain implant with at least the silicon nitride portion of the spacer on the sidewalls; and (j) performing a post-implant anneal with only the silicon nitride portion of the spacer on the sidewalls.

8. The process of claim 7, which further comprises the step of performing an anti-punchthrough implant subsequent to step (e) and prior to step (f).

9. The process of claim 7, which further comprises the step of performing at least one source/drain implant subsequent to step (e) and prior to step (f).

10. The process of claim 7, wherein said conformal silicon nitride layer has a thickness that is less than half the thickness of said conformal silicon dioxide layer.

11. The process of claim 7, wherein said insulative layer comprises silicon nitride.

12. The process of claim 7, wherein said silicon nitride portion has an "L"-shaped cross-section.

13. The process of claim 9, wherein said at least one source/drain implant is performed with only the silicon nitride portion of each spacer on the sidewalls.

14. The process of claim 9, wherein said at least one source/drain implant is performed with both portions of each spacer on the sidewalls.

15. The process of claim 7, wherein said post-implant anneal is performed at a temperature within a range of about 500° C. to 1,000° C.

16. A process for mitigating stress-induced damage to a silicon substrate during post-implant annealing of source/drain regions of a field-effect transistor, said transistor having a gate electrode which has been formed on the substrate, said electrode having sidewalls which are approximately normal to the substrate, said electrode also having an upper surface that is covered by an insulative layer, said process comprising the steps of:

(a) depositing a conformal silicon nitride layer which covers the substrate, the sidewalls and the insulative layer;

(b) depositing a conformal silicon dioxide layer which covers the conformal silicon nitride layer;

(c) performing an anisotropic etch which forms spacers on each of the sidewalls, each spacer having both a silicon nitride portion and a silicon dioxide portion;

(d) removing the silicon dioxide portion of each spacer;

(e) performing a post-implant anneal with only the silicon nitride portion of the spacer on the sidewalls.

17. The process of claim 16, wherein a source/drain implant is performed subsequent to step (d) and prior to step (e).

18. The process of claim 16, wherein said conformal silicon nitride layer has a thickness that is less than half the thickness of said conformal silicon dioxide layer.

19. The process of claim 16, wherein said insulative layer comprises silicon nitride.

20. The process of claim 16, wherein said silicon nitride portion has an "L"-shaped cross-section.

* * * * *